United States Patent
Kim et al.

(10) Patent No.: US 12,198,614 B2
(45) Date of Patent: Jan. 14, 2025

(54) MICRO LIGHT-EMITTING DIODE DISPLAY DEVICE AND METHOD FOR DRIVING SAME

(71) Applicant: KOREA UNIVERSITY RESEARCH AND BUSINESS FOUNDATION, Seoul (KR)

(72) Inventors: Tae Geun Kim, Seongnam-si (KR); Kyung Rock Son, Seoul (KR); Jun Young Kim, Hanam-si (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 18/292,555

(22) PCT Filed: Aug. 2, 2022

(86) PCT No.: PCT/KR2022/011388
§ 371 (c)(1),
(2) Date: Jan. 26, 2024

(87) PCT Pub. No.: WO2023/014042
PCT Pub. Date: Feb. 9, 2023

(65) Prior Publication Data
US 2024/0257713 A1 Aug. 1, 2024

(30) Foreign Application Priority Data
Aug. 4, 2021 (KR) .................. 10-2021-0102484

(51) Int. Cl.
*G09G 3/32* (2016.01)
*H01L 33/62* (2010.01)

(52) U.S. Cl.
CPC ............... *G09G 3/32* (2013.01); *H01L 33/62* (2013.01); *G09G 2300/043* (2013.01); *G09G 2320/0209* (2013.01); *G09G 2320/0257* (2013.01)

(58) Field of Classification Search
CPC ............... G09G 3/32; G09G 2300/043; G09G 2320/0209; G09G 2320/0257; H01L 33/62
See application file for complete search history.

(56) References Cited

U.S. PATENT DOCUMENTS
2015/0249096 A1    9/2015 Lupino et al.

FOREIGN PATENT DOCUMENTS
CN    112949848 A    6/2021
JP    4491207 B2    6/2010
(Continued)

OTHER PUBLICATIONS

International Search Report issued on Nov. 15, 2022, for corresponding International Patent Application No. PCT/KR2022/011388, along with an English translation (6 pages).
(Continued)

*Primary Examiner* — Michael Pervan
(74) *Attorney, Agent, or Firm* — Hauptman Ham, LLP

(57) ABSTRACT

A micro light-emitting diode display device having a resistive switching electrode to prevent a cross-talk phenomenon and a method for driving the same are provided. According to an embodiment of the inventive concept, the micro light-emitting diode display device includes a substrate, a light emitting unit formed on the substrate, and a resistive switching electrode formed on the light emitting unit, and configured to have a resistance changed depending on switching power. The resistive switching electrode includes a lower metal line formed on the light emitting unit, a
(Continued)

nonconductor line formed on the lower metal line to cross the lower metal line and including an insulating material, and an upper metal line stacked on the nonconductor line.

10 Claims, 11 Drawing Sheets

(56) References Cited

FOREIGN PATENT DOCUMENTS

| | | |
|---|---|---|
| KR | 10-2005-0088503 A | 9/2005 |
| KR | 10-1087013 B1 | 11/2011 |
| KR | 10-1278768 B1 | 6/2013 |
| KR | 10-2015-0109710 A | 10/2015 |
| KR | 10-2018-0060640 A | 6/2018 |
| KR | 10-2018-0123375 A | 11/2018 |
| KR | 10-2020-0005516 A | 1/2020 |

OTHER PUBLICATIONS

Written Opinion issued on Nov. 15, 2022, for corresponding International Patent Application No. PCT/KR2022/011388 (4 pages).

MICRO LIGHT-EMITTING DIODE DISPLAY DEVICE AND METHOD FOR DRIVING SAME

CROSS REFERENCE TO RELATED APPLICATION

The present application is a national stage filing under 35 U.S.C § 371 of PCT application number PCT/KR2022/011388 filed on Aug. 2, 2022, which is based upon and claims the benefit of priority to Korean Patent Application No. 10-2021-0102484, filed on Aug. 4, 2021, in the Korean Intellectual Property Office. All of the aforementioned applications are incorporated herein by reference in their entireties.

TECHNICAL FIELD

The inventive concept relates to a micro light-emitting diode display device, and more particularly relates to a micro light-emitting diode display device having a resistive switching electrode to prevent a cross-talk phenomenon and a method for driving the same.

The inventive concept is derived from research conducted as part of a study for leader support for creativity in a science and technology field by the Ministry of Science and ICT (MSIT; R&D) (Project No.; 1711112266, Project No.; 2016R1A3B190824923, Research project name; Study on High Efficiency Photoelectric Device Based on Glass Transparent Electrode, Project management institution; National Research Foundation of Korea, Task performing institution; Korea University, and Research Period: Mar. 1, 2021 to Feb. 28, 2021). Meanwhile, there is no property interest of the Korean government in any aspect of the inventive concept.

BACKGROUND ART

According to the PM-based display device, a light-emitting element corresponding to a pixel is disposed at each crossing point at which the data line crosses the scan line. As a voltage signal is sequentially applied to the data line and the scan line, a current is generated from a pixel by the difference between voltages generated from the two lines, and light is emitted from a point through which the current flows. According to such PM driving scheme, the operating scheme is significantly simple, and a structure and a manufacturing method is simpler when compared to an AM driving scheme. In addition, the PM driving scheme does not require an additional element such as a thin film transistor (TFT). Accordingly, the display is manufactured at a more economical price.

However, since pixels sequentially operate in unit of one line in the PM-based display device, as the number of lines is increased, it is difficult to implement a display having a higher resolution and higher quality. Accordingly, the operating time per pixel may be reduced, which degrades the quality and the brightness of a display image. In addition, as the distance between adjacent pixels is reduced due to the increase of the number of lines, the interference phenomenon named cross talk (e.g., an afterimage phenomenon) is caused, which is fatal to the display device.

Therefore, according to the PM driving scheme, only the level of SVGA-class image quality (800×600) or less is allowed, which is inappropriate to express the information on an image, such as a moving picture, having the higher resolution and rapidly changing. Furthermore, in a micro-LED display, which includes a significantly small light emitting element, described as a next-generation display, the number and the density of pixels per unit area are significantly increased. Accordingly, such a cross-talk phenomenon is more remarkably increased, which is fatal to implement a letter and an image.

Meanwhile, there is an isolation etching scheme as a scheme for implementing a display without a transfer technology for a light emitting element. The isolation etching scheme is to electrically insulate and isolate pixels by etching a conductive material (or a semiconductor layer) present between adjacent pixels. This is to block pixels, which are electrically adjacent to each other, from interfering with each other by removing a path for moving an electron, which is present in an n-metal electrode deposited on an n-type GaN semiconductor layer, into an adjacent pixel through the etching scheme.

However, the isolation etching scheme is neither economical nor eco-friendly, because an ICP-RIE etching scheme employing at least two power generators is used, instead of a typical etching scheme, to etch a relatively rigid GaN semiconductor layer having the thickness of several μm, and because toxic gas, such as chlorine gas (Cl2), is used in this process. In addition, as an etching depth is increased to completely remove the cross-talk phenomenon, the area of the sidewall to be etched is increased, and the performance of the device is rapidly degraded due to a non-radiative recombination level formed on the sidewall. When the etching depth is limited to a specific level to prevent the above problems, the cross-talk phenomenon is made to restrict the implementation of a display having a higher resolution.

When the transfer technology for the light emitting element is used, the pixel is physically cut (dicing) on a GaN substrate, and then transferred to a display substrate. Accordingly, the electrical isolation between adjacent pixels is completely achieved. However, since millions of micro-LED light sources (pixels) having the thickness of several μm have to be cut and transferred, the accuracy and yield rate are important in cutting machines and transferring technologies. In addition, even if the micro-LED light sources are completely transferred to the display substrate, the distance between the data/scan lines is significantly narrowed to implement an array display having a higher resolution of at least 5,000 PPI and a higher density. In this case, as the distance between lines is significantly narrowed, even if a voltage signal is applied only one line, a voltage signal is partially applied to adjacent peripheral lines. Accordingly, the electrical cross-talk phenomenon is more remarkably appeared.

DETAILED DESCRIPTION OF THE INVENTION

Technical Problem

The inventive concept is to provide a micro light-emitting diode display device having a resistive switching electrode to prevent a cross-talk phenomenon and a method for driving the same.

Technical Solution

According to an embodiment of the inventive concept, a micro light-emitting diode display device includes a substrate, a light emitting unit formed on the substrate, and a resistive switching electrode formed on the light emitting unit, and formed to have a resistance changed depending on switching power.

The resistive switching electrode includes a lower metal line formed on the light emitting unit, a nonconductor line formed on the lower metal line to cross the lower metal line and including an insulating material, and an upper metal line stacked on the nonconductor line.

According to an embodiment of the inventive concept, the micro light-emitting diode display device may further include an n-type electrode formed on the substrate to receive a common ground voltage, and an insulating layer formed to insulate the n-type electrode from the resistive switching electrode. The upper metal line includes a p-type electrode.

The resistive switching electrode may further include a switching unit formed to form a current path on the nonconductor line or remove the current path from the nonconductor line by applying a switching electrical signal to the upper metal line.

The switching unit may be formed to switch a state of the resistive switching electrode to be in an operating state, by forming the current path on the nonconductor line, as a set voltage is applied to the upper metal line, right before a data voltage is applied to the lower metal line.

The switching unit may be formed to switch a state of the resistive switching electrode to be in a non-emissive state, by removing the current path, as a reset voltage is applied to the upper metal line, right after a data voltage is applied to the lower metal line.

The insulating material may include an oxide semiconductor material for forming an oxygen vacancy in the nonconductor line through the switching electrical signal.

The oxide semiconductor material may include at least one material selected from the group consisting of NiO, ZnO, TaOx, TiOx, HfOx, WOx, AlOx, and $Y_3Fe_5O_{12}$.

According to an embodiment of the inventive concept, a method for driving the micro light-emitting diode display device includes switching, by a switching unit, a state of the resistive switching electrode to be in an operating state, by forming the current path on the nonconductor line, as a set voltage is applied to the upper metal line, right before a data voltage is applied to the lower metal line, and switching, by the switching unit, the state of the resistive switching electrode to be in a non-emissive state, by removing the current path, as a reset voltage is applied to the upper metal line, right after the data voltage is applied to the lower metal line.

The set voltage may be set to a voltage higher than a first reference voltage allowing injection of a hole into the light emitting unit in the operating state The reset voltage may be set to a voltage lower than a second reference voltage to prevent a cross-talk phenomenon, as hole injection into the light emitting unit is prevented in the non-emissive state, and the second reference voltage may be lower than the first reference voltage.

Advantageous Effects of the Invention

According to an embodiment of the inventive concept, the micro light-emitting diode display device having the resistive switching electrode and the method for driving the same may be provided to prevent the cross-talk phenomenon.

BEST MODE

Figure 1:
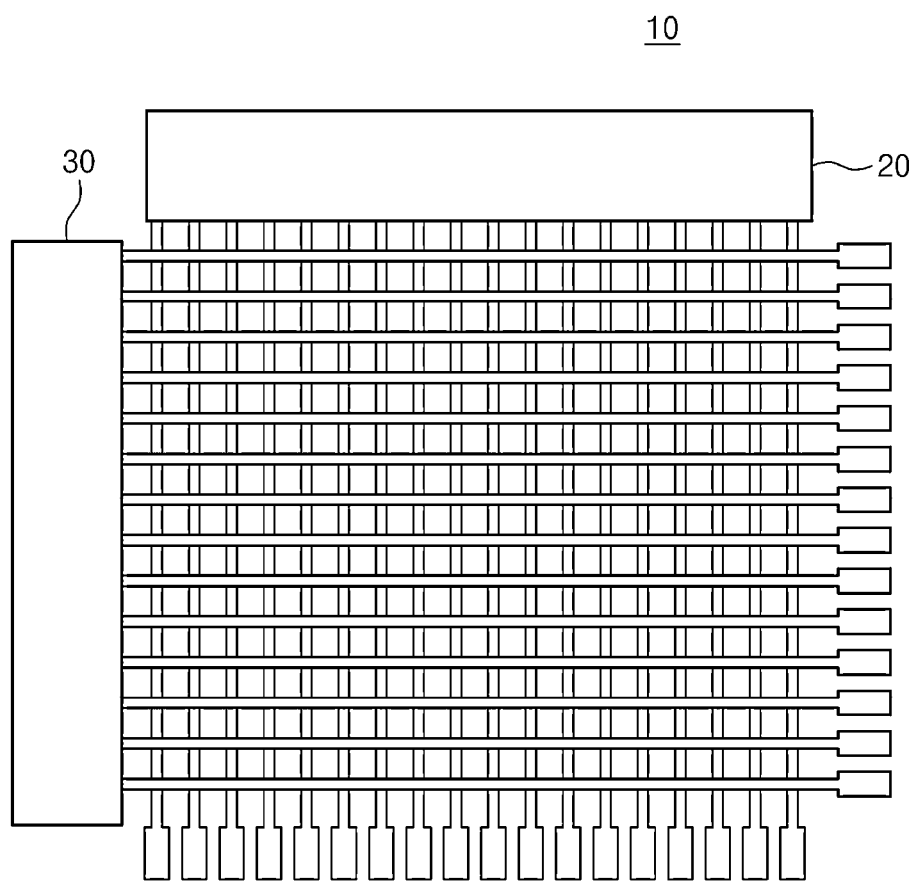
FIG. 1 is a schematic view of a display panel including a micro light-emitting diode display device according to an embodiment of the inventive concept.

Hereinafter, an embodiment of the inventive concept will be described in more detail with reference to the accompanying drawings. In the following description of the inventive concept, in the case where it is determined that the detailed description of a related known configuration or function may make the subject matter of the inventive concept unclear, the details thereof may be omitted. The embodiments of the inventive concept are provided to describe the inventive concept for those skilled in the art more completely, and may be modified in various forms in the following description, and the scope of the inventive concept should not be construed to be limited to the following description. Rather, these embodiments are provided as examples so that the inventive concept will be thorough and complete, and will fully convey the concept of the inventive concept to those skilled in the art.

In the drawings, embodiments of the inventive concept are not limited to the specific examples provided herein and are exaggerated for clarity. The terms used herein are provided to describe embodiments, not intended to limit the inventive concept. In the specification, a singular form may include plural forms unless otherwise specified.

FIG. 1 is a schematic view of a display panel including a micro light-emitting diode display device according to an embodiment of the inventive concept. Referring to FIG. 1, according to an embodiment of the inventive concept, a display panel 10 including the micro light-emitting diode display device, which serves as a passive matrix-based display device, is implemented in the form of a matrix formed, as a plurality of data lines drive by a data driving unit 20 and a plurality of scan lines drive by a scan driving unit 30. A light emitting element corresponding to a pixel is disposed at each crossing point at which the data line crosses the scan line. As a voltage signal is sequentially applied to the data lines and the scan lines, a current is generated from a pixel by the difference between voltages generated from the two lines, and light is emitted from a point through which the current flows.

Figure 2:
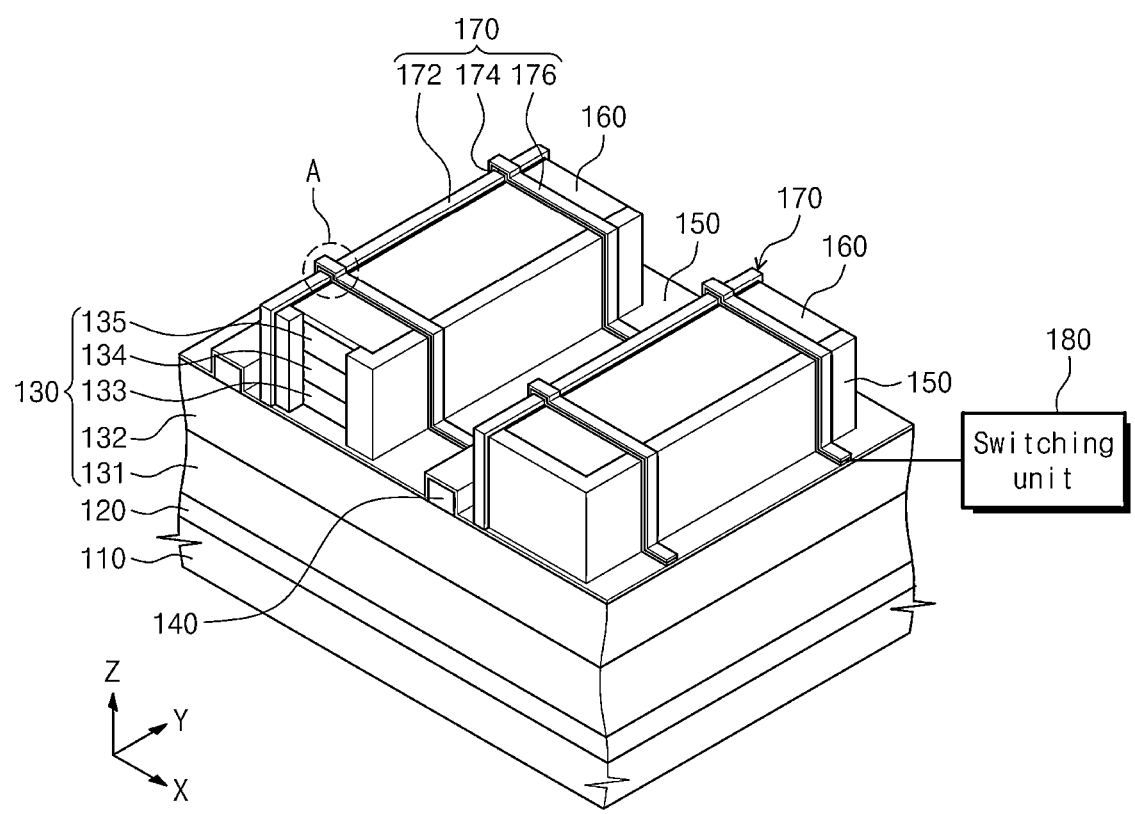
FIG. 2 is a schematic view illustrating a micro light-emitting diode display device according to an embodiment of the inventive concept.
Figure 3:
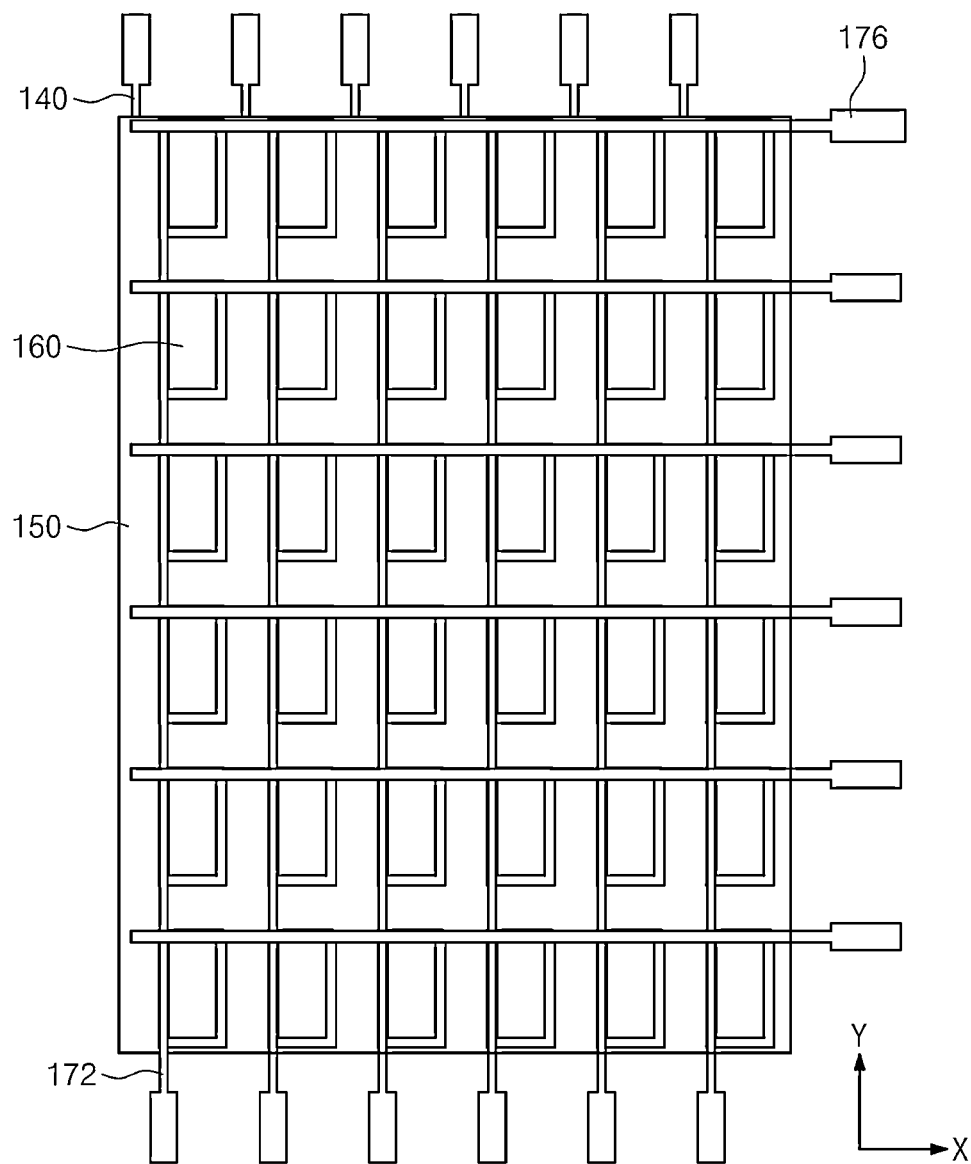
FIG. 3 is a plan view illustrating a micro light-emitting diode display device according to an embodiment of the inventive concept.
Figure 4:
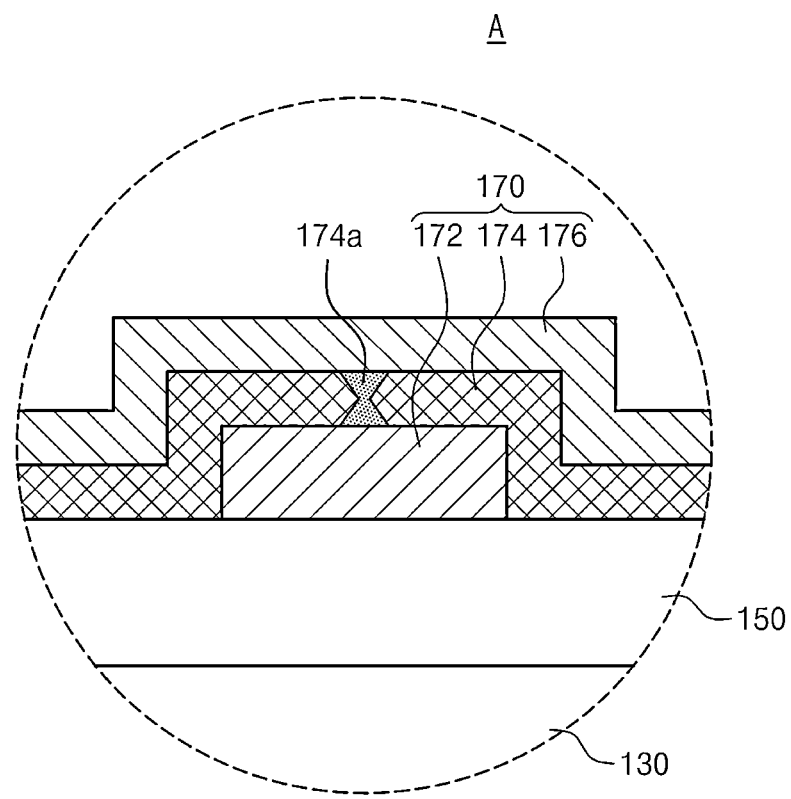
FIG. 4 is an enlarged view of a part 'A' of FIG. 2.

FIG. 2 is a schematic view illustrating a micro light-emitting diode display device according to an embodiment of the inventive concept. FIG. 3 is a plan view illustrating a micro light-emitting diode display device according to an embodiment of the inventive concept. FIG. 4 is an enlarged view of a part 'A' of FIG. 2. Referring to FIGS. 1 to 4, according to an embodiment of the inventive concept, the micro light-emitting diode display device 100 may include a substrate 110, a buffer layer 120, a light emitting unit 130, an n-type electrode (first electrode) 140, a passive layer 150, a diffusion layer 160, and a resistive switching electrode 170.

The substrate 110 may be provided in the form of various substrates, such as a sapphire substrate, a glass substrate, a silicon substrate, a semiconductor substrate, or a flexible substrate. The light emitting element 110 may be formed on the buffer layer 120 of the substrate 110. According to an embodiment, the light emitting unit 130 may include an undoped GaN (u-GaN) layer 131, an n-type doped GaN (n-GaN) layer 132 on the u-GaN layer 131, an n-GaN pixel 133 provided for each pixel on the n-GaN layer 132, a light emitting pixel 134 on the n-GaN pixel 133, and a p-type doped GaN (p-GaN) pixel 135.

The n-type electrode 140 may be formed on the substrate 110. A common ground voltage may be applied to the n-type electrode 140. The passive layer 150 may be formed to insulate the n-type electrode 140 from the resistive switching electrode 170. The diffusion layer 160 may be formed on the light emitting unit 130 to increase the light extraction efficiency of the light emitting unit 130 by current spreading. The diffusion layer 160 may be formed of a light-transmitting material, such as indium tin oxide (ITO).

The resistive switching electrode 170 may be formed on the light emitting unit 130. The resistive switching electrode 170 may be formed to have a resistance varied depending on switching power. The resistive switching electrode 170 may include a lower metal line 172, a nonconductor line 174, an upper metal line 176, and a switching unit 180.

The lower metal line 172 may be formed on the light emitting unit 130. The lower metal line 172 may be formed in a first direction in which the n-type electrode 140 is aligned. The lower metal line 172 may receive a data voltage by the data driving unit 20. The lower metal line 172 may be formed of a first metal material.

The nonconductor line 174 may be formed on the lower metal line 172 to cross the lower metal line 172 (for example, the nonconductor line 174 vertically crossing the lower metal line 172). The nonconductor line 174 may be formed of an insulating material. The insulating material of the nonconductor line 174 may include an oxide semiconductor material having an oxygen vacancy formed in the nonconductor line 174 by a switching electrical signal. The oxide semiconductor material may include at least one selected from the group consisting of NiO, ZnO, TaOx, TiOx, HfOx, WOx, AlOx, and $Y_3Fe_5O_2$.

The upper metal line 176 may be stacked on the nonconductor line 174. The upper metal line 176 may be formed in parallel to the nonconductor line 174 in a second direction perpendicular to the first direction in which the n-type electrode 140 and the lower metal line 172 are aligned. The upper metal line 176 may include a p-type electrode (the second electrode). The lower metal line 176 may be formed of a second metal material.

The lower metal line 172, the nonconductor line 174, and the upper metal line 176 may be deposited such that light extraction effect is minimized as the resistive switching electrode 170 covers only a portion of the micro-LED light source.

The switching unit 180 may be configured to form or remove a current path 174a on the nonconductor line 174 by applying a switching electrical signal (scan signal) to the upper metal line 176.

The scan driving unit 30 may be configured to switch the switching electrode 170 to be in an operating state by forming the current path 174a on the nonconductor line 174, as the set voltage is applied to the upper metal line 176 right before the data voltage is applied to the lower metal line 172. The set voltage may be set to a voltage higher than a first reference voltage allowing hole injection into the light emitting unit 130.

The switching unit 180 may be configured to switch the resistive switching electrode 170 to be in a non-emissive state by removing the current path 174a on the upper metal line 176 right after the data voltage is applied to the lower metal line 172. The reset voltage may be set to a voltage lower than a second reference voltage to prevent the cross-talk phenomenon, as hole injection into the light emitting unit 130 is prevented in the non-emissive state. In this case, the second reference voltage may be a voltage lower than the first reference voltage set related to the set voltage.

According to an embodiment of the inventive concept, since an electrical signal is necessary to form or remove the current path in the nonconductor material, the data line utilized as the n-metal electrode of an existing LED may be designed as the lower metal line 172 of the resistive switching electrode 170, and the n-type electrode 140 may be designed as a common ground line (about 0 V).

Accordingly, the data line and the n-type electrode line are arranged in parallel to each other. The data line is formed in the form of a cross-bar array together with the scan line to control the o/off state of the resistive switching electrode present at each crossing point between two lines. In other words, the data line is used to control the injection of holes applied to a pixel to control light emitting of the pixel.

Figure 5:
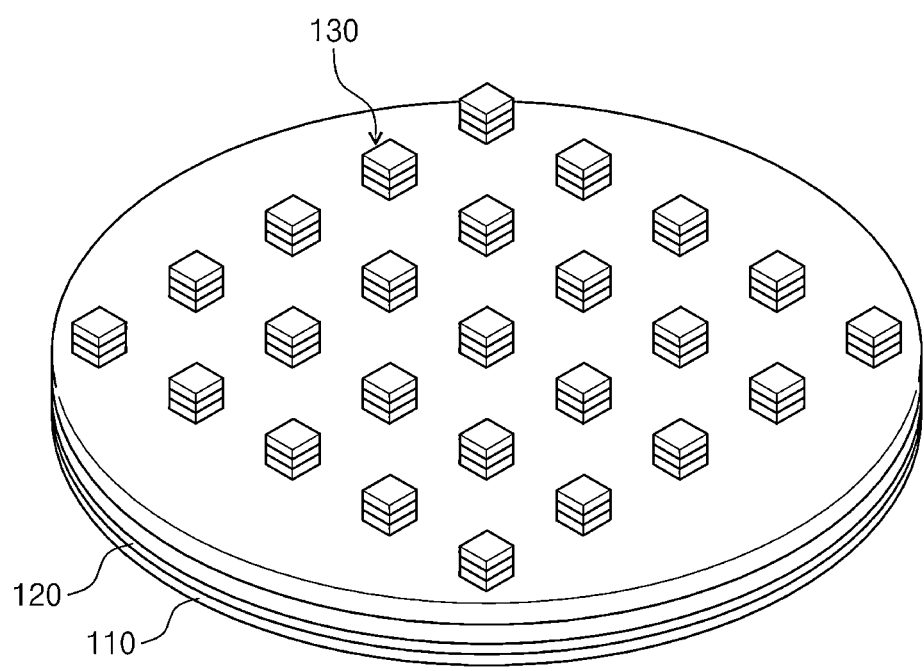
FIGS. 5 to 10 are views illustrating the manufacturing process of a micro light-emitting diode display device according to an embodiment of the inventive concept.
Figure 6:
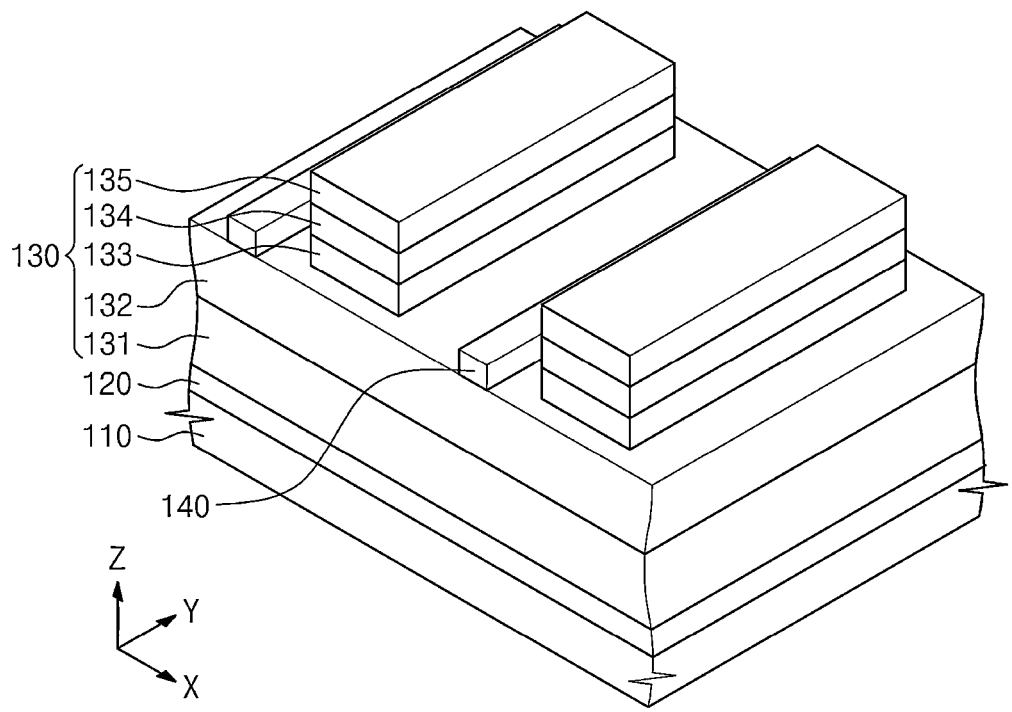

FIGS. 5 to 10 are views illustrating the manufacturing process of a micro light-emitting diode display device according to an embodiment of the inventive concept. Referring to FIGS. 5 and 6, after forming the light emitting unit 130 including the u-GaN layer 131, the n-GaN layer 132, the n-GaN pixel (the first semiconductor layer) 133, the light emitting pixel 134, and the p-GaN pixel (second semiconductor layer) 135 on the buffer layer 120 of the GaN substrate 110 through the MESA etching process as illustrated in FIG. 5, the n-type electrode 140 may be deposited on the n-GaN layer 132 of the substrate 110 as illustrated in FIG. 6. The light emitting pixel 134 may be implemented with, for example, a multi-quantum well (MQW) active layer.

Figure 7:
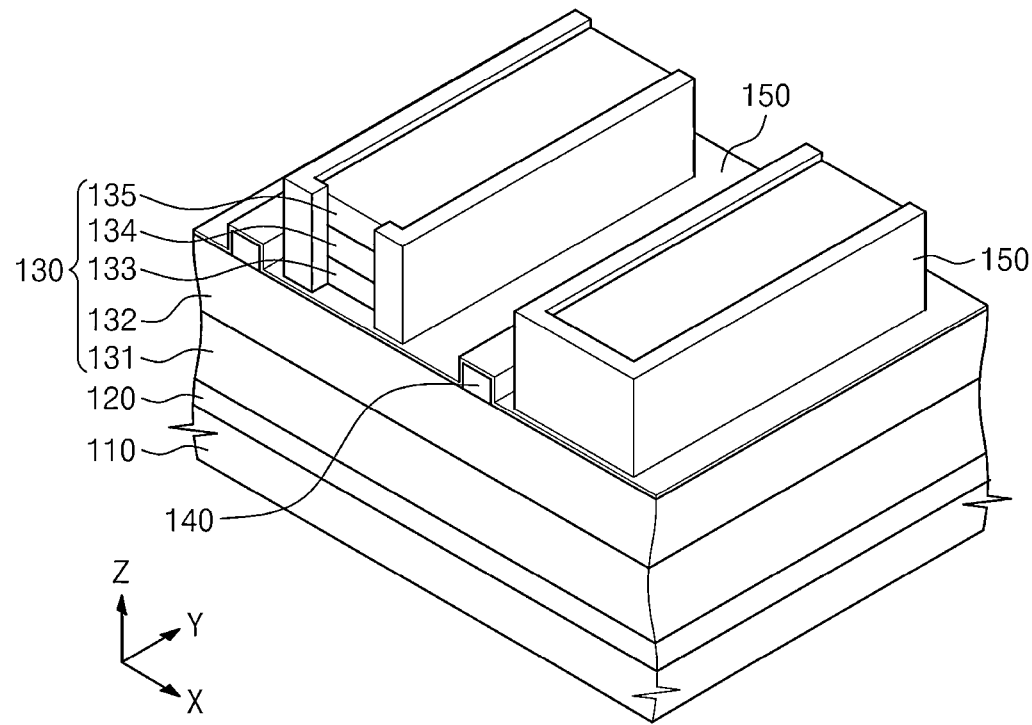
Figure 8:
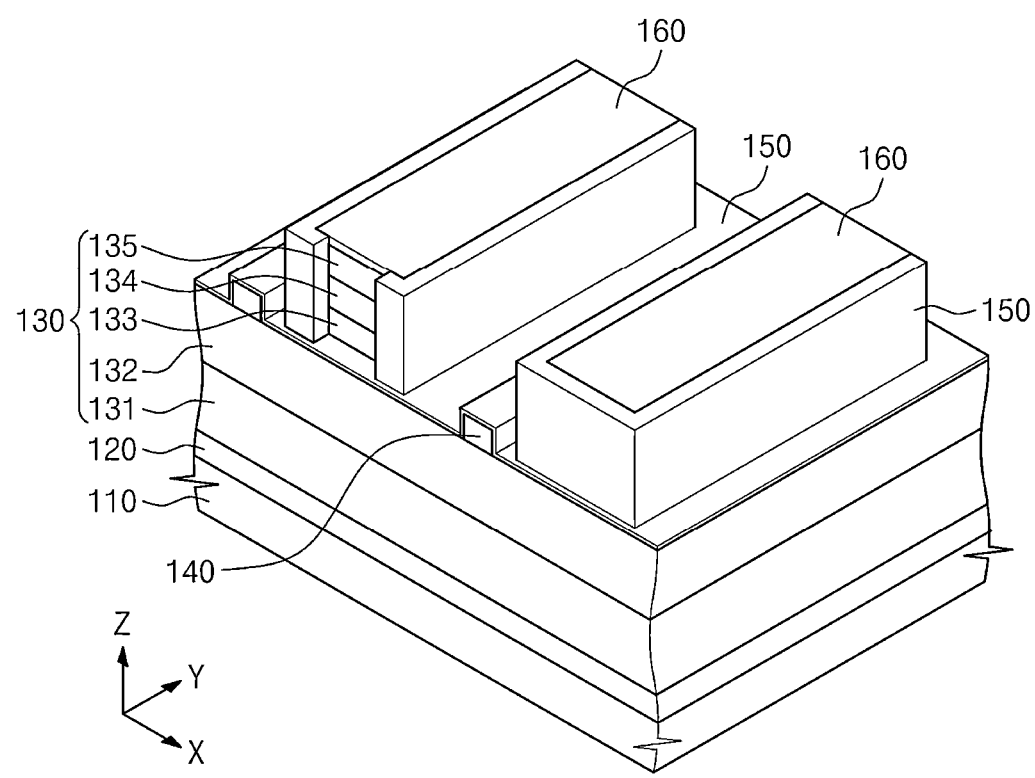

Next, as illustrated in FIG. 7, the passive layer 150 is deposited to prevent the interference between the n-type electrode 140 and the p-type electrode. Thereafter, to extract the maximum light extraction efficiency from the pixel of the light emitting unit 130, the diffusion layer 160 to perform current spreading is deposited on the p-GaN pixel 135 of the light emitting unit 130 as illustrated in FIG. 8. The diffusion layer 160 may be implemented, for example, by using a transparent electrode such as indium tin oxide (ITO).

Figure 9:
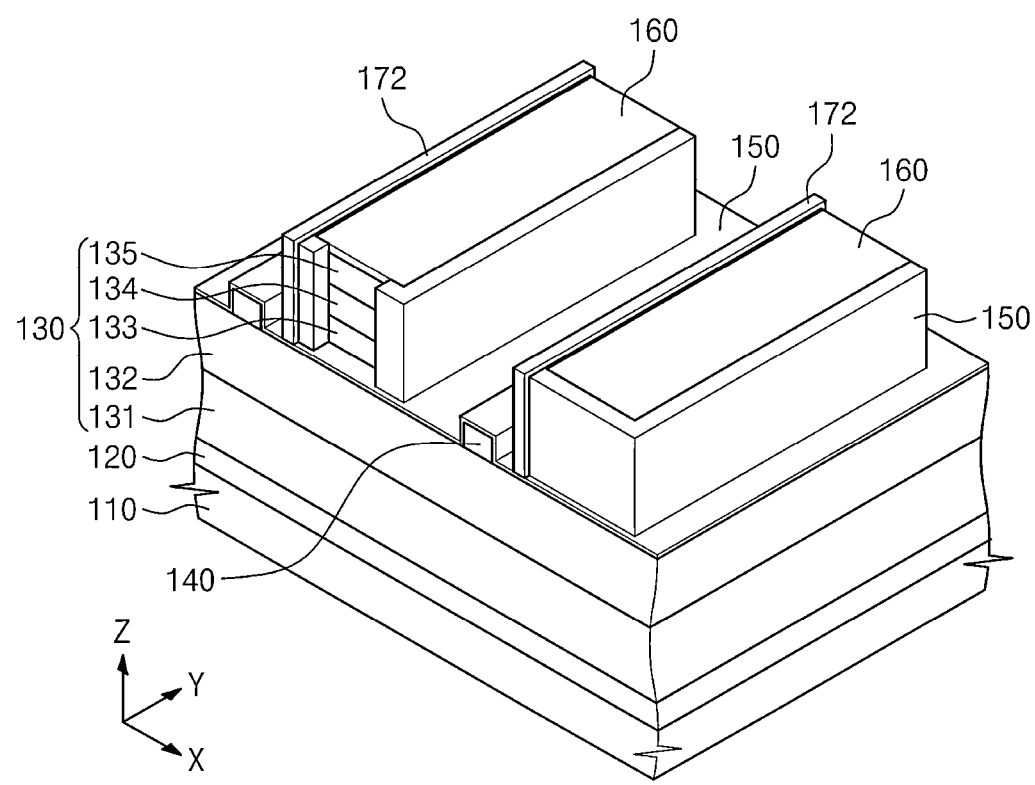
Figure 10:
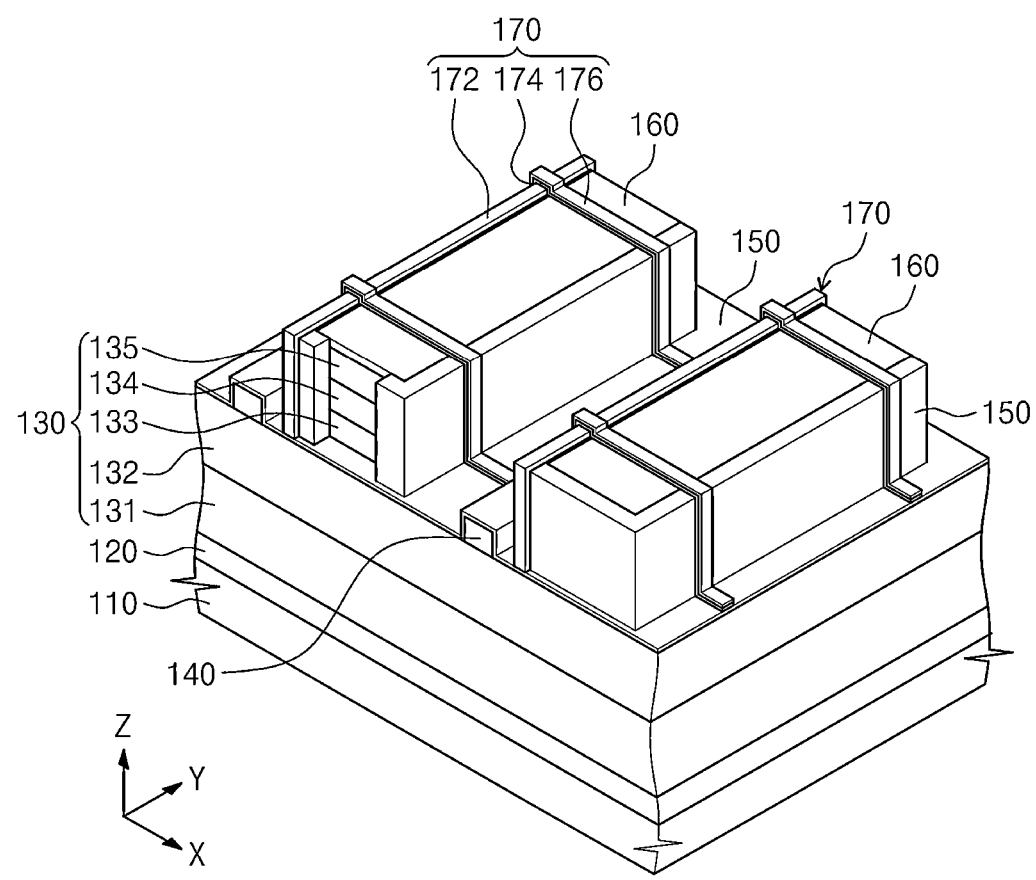

Thereafter, as illustrated in FIG. 9, the metal material to form the lower metal line 172 of the resistive switching electrode 170 is deposited on the p-GaN pixel 135 of the light emitting unit 130. Finally, the nonconductor material and the metal material are sequentially deposited on the lower metal line 172 to form the nonconductor line 174 and the upper metal line 176 of the resistive switching electrode 170 as illustrated in FIG. 10.

As described above, after manufacturing an electrode having the resistive switching characteristic in the micro-LED display light emitting unit (micro-LED light source), the switching on/off characteristic of the electrode is utilized, thereby preventing the cross-talk which is an electrical/optical interference between adjacent pixels formed when higher-density display array.

In addition, a novel line having a double layer structure including a metal layer/nonconductor is designed in the form of a cross-bar under the p-type metal electrode before depositing the p-type metal electrode (the second electrode) of the micro-LED light source, and the flow of the hole injected into the micro-LED is controlled by using the nonconductor characteristic and perfectly prohibit the cross-talk phenomenon.

The P-type electrode structure of the micro-LED has the form of a lower metal/nonconductor/upper metal layer to form or remove the current path inside the nonconductor material in response to the electrical signal applied to the upper and lower metal layer. The flow of the hole is perfectly blocked and adjusted by using an electrode having an on/off switching function even if the interference of the current and the voltage is made by the peripheral pixel, thereby removing the cross-talk phenomenon caused through the PM driving scheme.

Accordingly, the cross-talk phenomenon (after-image phenomenon) may be overcome without the additional etching process such as an isolation etching process. In addition, when the isolation etching scheme is used, the performance of the light emitting unit device is lowered due to the non-radiative recombination level formed on a sidewall. According to an embodiment of the inventive concept, as the isolation etching scheme is not used, the problem related to the device performance degradation is not caused, thereby improving the electrical/optical characteristic of the light emitting device (micro-LED).

Figure 11:
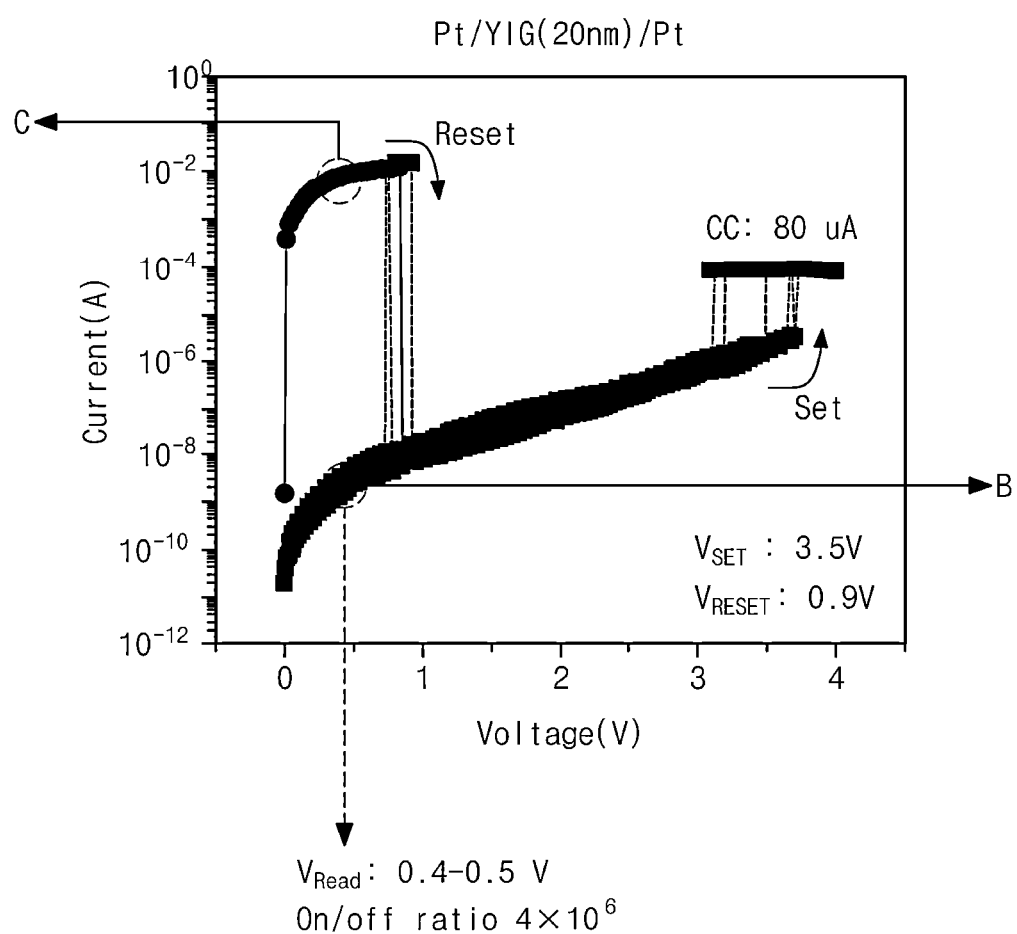
FIG. 11 is a view illustrating a method for adjusting an on/off state of a resistive switching electrode constituting a micro light-emitting diode display device according to an embodiment of the inventive concept.

This allows the micro-LED display based on the PM driving scheme having the higher resolution in a small-type display, such as virtual reality, a pico-projector, a smart watch, or a smart glass, requiring an image implemented with a higher resolution within a unit area FIG. 11 is a view illustrating a method for adjusting an on/off state of a resistive switching electrode constituting a micro light-emitting diode display device according to an embodiment of the inventive concept. Hereinafter, the method for adjusting the on/off state of the resistive switching electrode 170 will be described with reference to FIGS. 2 and 11. A horizontal axis of FIG. 11 indicates a voltage applied between the upper metal line 176 and the lower metal line 172 of the resistive switching electrode 170 and a vertical axis indicates a current flowing along the nonconductor line 174, as the voltage is applied.

To perform an experiment for determining a characteristic of adjusting the on/off state of the resistive switching electrode 170, titanium (Ti) and platinum (Pt) are sequentially deposited on the silicon wafer, which includes an $SiO_2$ oxide layer having the thickness of 1000 Å, are sequentially deposited and patterned with the thickness ranging 20 nm to 50 nm, thereby forming the lower metal line. In addition, Yttrium Iron garnet (YIG) is deposited with the thickness of 20 nm to cover the substrate and the lower metal line. Thereafter, platinum (Pt) is deposited and patterned with the thickness of 100 nm on YIG to form the nonconductor line and the upper metal line to cross the lower metal line.

The resistive change characteristic was measured by applying a switching voltage to the resistive switching electrode 170 in the structure of a Ti/Pt lower metal line/YIG nonconductor line/Pt upper metal line. Referring to FIG. 11, when a voltage is gradually increasingly applied between the upper/lower metal lines, a lower current level is showed as in part 'B' at the initial state, and then a current is instantaneously sharply increased at about 3.5 V. This phenomenon is expressed as 'Set' as illustrated in FIG. 11. After the 'Set' phenomenon, the voltage is cut off, and the voltage starts to be applied from 0 V. In this case, a higher current level is observed as in part 'C' of the graph. This current level indicates a 'low resistance state', and the resistance is observed as at a level of about 58Ω.

Thereafter, when the voltage is continuously increased, the current is instantaneously sharply decreased at about 1 V, which is marked as 'Reset' as illustrated in FIG. 11. A lower-resistance state is changed to a higher-resistance state, again, due to the 'Reset' phenomenon. In other words, the voltage is cut off, after the 'Reset' phenomenon, and then starts to be applied from 0 V. In this case, the graph corresponding to the higher-resistance state was observed. In this case, the resistance value was observed as being in a level of about 250 MΩ. As a result, the on/off ratio of the higher-resistance state to the lower-resistance state of the resistive switching electrode 170 was measured to about $4\times10^6$, which is a level of clearly switching the state of a current between a flowing state and a cut-off state.

Figure 12:
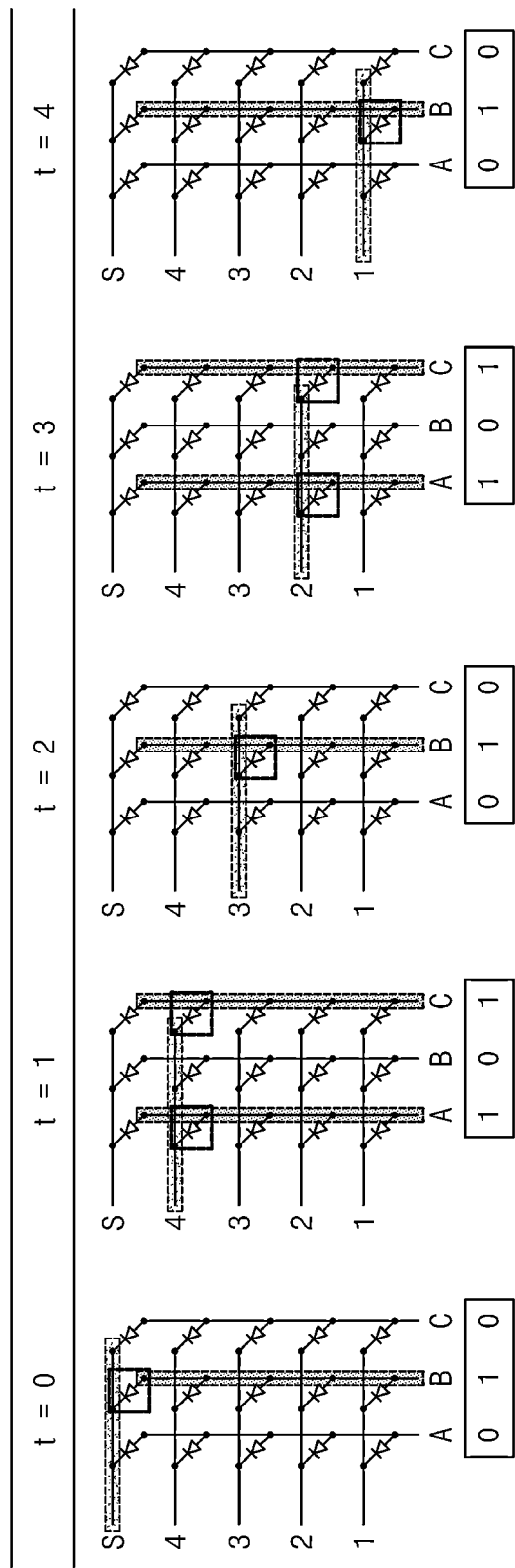
FIG. 12 is a view illustrating a method for driving a display.

FIG. 12 is a view illustrating a method for driving a display. Regarding the conventional display driving scheme, the conventional display driving scheme serves as the sequence scheme. For example, when a scan line in the first row is selected in response to a first scan line signal, data lines (columns) of pixels to be emitted with light are selected together, the light is emitted from an LED present at a point, which has a voltage difference, of crossing points between the scan line in the first row and the data lines. Next, the scan line signal in the first row and the data line signal based on the scan line signal in the first row are disappeared, and a scan line in a second row is selected in response to a second scan line signal. Similarly, the data line of the pixel to be emitted with the light is selected in a second row.

The scan line is sequentially selected from scan line #1 to scan line #n and a relevant data signal is applied. This process is rapidly performed within a shorter period of time (of several μs). The eyes of a human being may recognize signals as if the signals are simultaneously applied from scan line #1 to scan line #n to from one pattern or one image. The conventional PM driving scheme includes two steps of 1) applying the first scan line signal and of inputting a data line signal and 2) cutting off the first scan line signal and cutting off the data line signal (thereafter, iteration until the n-th scan line). In other words, the step count of '2n' is necessary depending on the number of lines of an array (n×n).

To the contrary, in the PM driving scheme according to an embodiment of the inventive concept, signals are sequentially applied, which is similar to the conventional scheme. However, the difference between the inventive concept and the conventional scheme is in that the existing n-type electrode is connected to receive the common ground (of about 0 V) line signal instead of being connected to the data line, and the data line is connected to the lower metal line of the resistive switching electrode 170. The following operating procedure is performed in this connection state.

At the first step, the first scan line signal is applied to the upper metal line of the resistive switching electrode 170 while the data line signal is applied to the lower metal line. This corresponds to that the set signal (the set voltage) is applied. Accordingly, the resistive switching electrode 170 is changed to be in the lower-resistance state, such that holes are selectively injected.

At the second step, after turning off (floating) the data line corresponding to the lower metal line of the resistive switching electrode 170, the data line signal is input again. This corresponds to that the reset signal (reset voltage) is input. Accordingly, the resistive switching electrode 170 is changed to be in the higher resistance after the pixel emits light, and is returned to be in an existing state.

At the third step, the first scan line signal is cut off from the upper metal line of the resistive switching electrode 170 while the data line signal is cut off from the lower metal line. The steps are iterated till the n-th scan line, and the step count of '3n' is necessary depending on the number of lines of the array (n×n).

Accordingly, on the assumption that the resolution of the display array is n×n, even though the step count of a signal to be input is increased from 2n to 3n, the resistive switching electrode 170 may operate within several ns. Accordingly, the additional step count does not serve as a problem, when considering several ms which is the operating speed of the general display.

Figure 13:
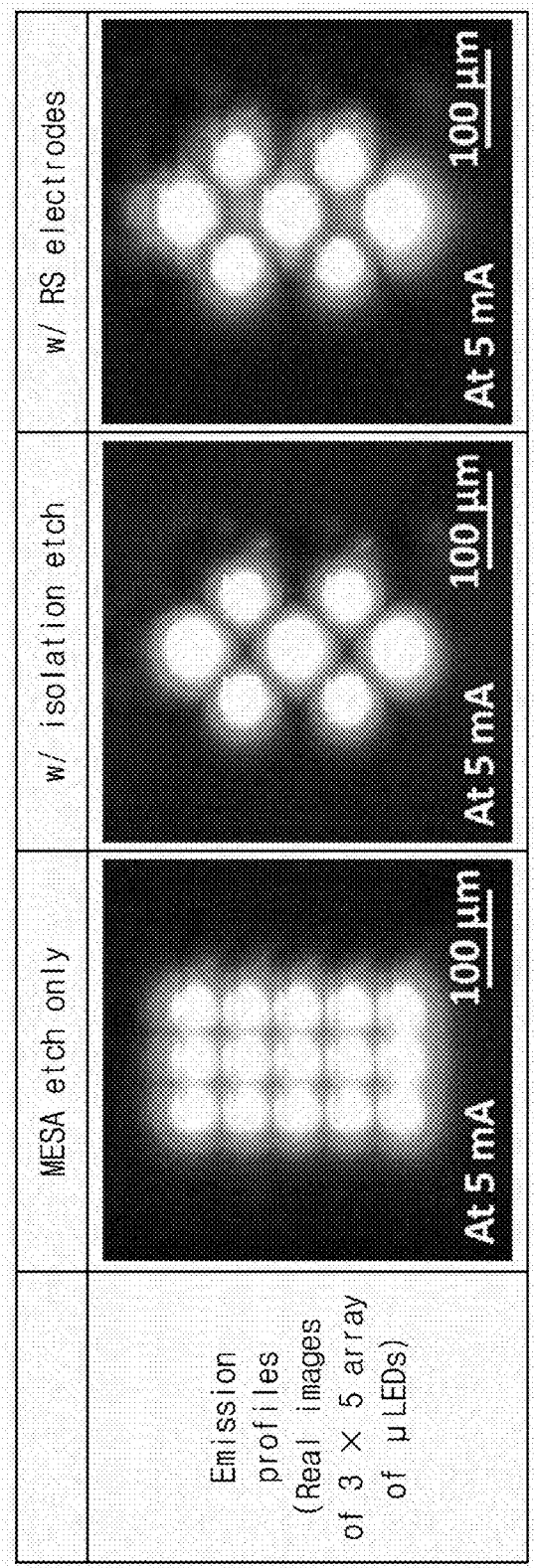
FIG. 13 is a view illustrating an image displayed by a micro light-emitting diode display device.

FIG. 13 is a view illustrating an image displayed by a micro light-emitting diode display device according to an embodiment of the inventive concept. The micro light-emitting diode display device (w/RS electrode) was manufactured according to an embodiment of the inventive concept, and a number '8' was realized using a micro-LED. According to an embodiment of the inventive concept, it may be recognized that the image is realized without the cross-talk after image, even though the isolation etching scheme is not performed.

As described above, an embodiment of the inventive concept has been described for the illustrative purpose, but the inventive concept is not limited thereto. The inventive concept should be understood as having the widest scope based on the fundamental technical spirit of the inventive concept. Those skilled in the art can reproduce the inventive concept in a pattern not described therein through the combination and the substitution of embodiments disclosed herein, without departing from the scope of the inventive concept. In addition, it is obvious that those skilled in the art may easily change or modify the disclosed embodiment, based on the present specification, and the change or the modification belongs to the scope of the inventive concept.

The invention claimed is:

1. A micro light-emitting diode display device comprising:
   a substrate;
   a light emitting unit formed on the substrate; and
   a resistive switching electrode formed on the light emitting unit, and configured to have a resistance changed depending on switching power,
   wherein the resistive switching electrode includes:
   a lower metal line formed on the light emitting unit;
   a nonconductor line formed on the lower metal line to cross the lower metal line and including an insulating material; and
   an upper metal line stacked on the nonconductor line.

2. The micro light-emitting diode display device of claim 1, further comprising:
   an n-type electrode formed on the substrate to receive a common ground voltage; and
   an insulating layer formed to insulate the n-type electrode from the resistive switching electrode,
   wherein the upper metal line includes a p-type electrode.

3. The micro light-emitting diode display device of claim 1, wherein the resistive switching electrode further includes:
   a switching unit configured to form a current path on the nonconductor line or remove the current path from the nonconductor line by applying a switching electrical signal to the upper metal line.

4. The micro light-emitting diode display device of claim 3, wherein the switching unit is configured to switch a state of the resistive switching electrode to be in an operating state, by forming the current path on the nonconductor line, as a set voltage is applied to the upper metal line, right before a data voltage is applied to the lower metal line.

5. The micro light-emitting diode display device of claim 3, wherein the switching unit is configured to switch a state of the resistive switching electrode to be in a non-emissive state, by removing a current path, as a reset voltage is applied to the upper metal line, right after a data voltage is applied to the lower metal line.

6. The micro light-emitting diode display device of claim 3, wherein the insulating material includes an oxide semiconductor material for forming an oxygen vacancy in the nonconductor line through the switching electrical signal.

7. The micro light-emitting diode display device of claim 6, wherein the oxide semiconductor material includes:
   at least one material selected from the group consisting of NiO, ZnO, TaOx, TiOx, HfOx, WOx, AlOx, and $Y_3Fe_5O_{12}$.

8. A method for driving the micro light-emitting diode display device of claim 1, the method comprising:
   switching, by a switching unit, a state of the resistive switching electrode to be in an operating state, by forming a current path on the nonconductor line, as a set voltage is applied to the upper metal line, right before a data voltage is applied to the lower metal line; and
   switching, by the switching unit, the state of the resistive switching electrode to be in a non-emissive state, by removing the current path, as a reset voltage is applied to the upper metal line, right after the data voltage is applied to the lower metal line.

9. The micro light-emitting diode display device of claim 8, wherein the set voltage is set to a voltage higher than a first reference voltage allowing injection of a hole into the light emitting unit in the operating state.

10. The micro light-emitting diode display device of claim 9, wherein the reset voltage is set to a voltage lower than a second reference voltage to prevent a cross-talk phenomenon, as hole injection into the light emitting unit is prevented in the non-emissive state, and
   wherein the second reference voltage is lower than the first reference voltage.

* * * * *